United States Patent [19]

Havens

[11] Patent Number: 5,369,179
[45] Date of Patent: Nov. 29, 1994

[54] INHERENTLY ANTISTATIC THERMOPLASTIC POLYAMIDE-POLYETHER FILMS

[75] Inventor: Marvin R. Havens, Greer, S.C.

[73] Assignee: W. R. Grace & Co.-Conn., Duncan, S.C.

[21] Appl. No.: 695,175

[22] Filed: May 3, 1991

Related U.S. Application Data

[63] Continuation-in-part of Ser. No. 647,859, Jan. 30, 1991, abandoned, which is a continuation-in-part of Ser. No. 578,961, Sep. 7, 1990, abandoned.

[51] Int. Cl.$^5$ ................................................ C08F 8/32
[52] U.S. Cl. ..................................... 525/183; 525/430; 428/409; 264/308; 264/331.21
[58] Field of Search ..................... 525/430, 432, 183; 264/340, 308; 428/409

[56] References Cited

U.S. PATENT DOCUMENTS

| | | | |
|---|---|---|---|
| 4,331,786 | 5/1982 | Foy et al. | 525/408 |
| 4,332,920 | 6/1982 | Foy et al. | 525/408 |
| 4,361,680 | 11/1982 | Borg et al. | 525/420 |
| 4,899,521 | 2/1990 | Havens | 53/461 |

FOREIGN PATENT DOCUMENTS

| | | | |
|---|---|---|---|
| 23435 | 2/1985 | Japan | 525/183 |
| 64-90246 | 4/1989 | Japan . | |

*Primary Examiner*—John Kight, III
*Assistant Examiner*—R. F. Johnson
*Attorney, Agent, or Firm*—William D. Lee, Jr.; John J. Wasatonic; L. George Legg

[57] ABSTRACT

Disclosed is a thermoplastic flexible film suitable for wrapping static sensitive devices such as electronic circuit boards. The film is made of an inherently hydrophilic polyether block amide copolymer in blend with a compatible polymer. Compatible polymers typically are amide polymers or are acid copolymers, such as the nylons or ionomers. The film does not have a degree of hydrophilicity unsuitable for packaging static sensitive devices. Yet the film is antistatic without requiring the addition of an antistatic agent.

6 Claims, No Drawings

INHERENTLY ANTISTATIC THERMOPLASTIC POLYAMIDE-POLYETHER FILMS

This application is a continuation-in-part application of U.S. Ser. No. 647,859, filed Jan. 30, 1991, now abandoned, which is a continuation-in-part application of U.S. Ser. No. 578,961, filed Sep. 7, 1990, now abandoned, the disclosure of which is incorporated herein by reference.

FIELD OF THE INVENTION

This invention relates to thermoplastic polymeric flexible films having long-term antistatic characteristics. Such are useful, for instance, for packaging for electronic devices that are sensitive to static electricity. More particularly, this invention relates to such films comprising a polymer chosen from the hydrophilic polyether block amides, together with a compatible polymer. The film is antistatic without having to add an antistatic agent thereto, and due to the presence of the compatible polymer, does not have a hydrophilicity problem (which could cause corrosion of a circuit board wrapped therewith) despite the presence of the hydrophilic polyether block amide copolymer.

Particularly with regard to the new matter in the instant continuation-in-part, it has been unexpectedly discovered that when the compatible polymer was a metal ionomer where the metal was polyvalent, for instance a +2 metal such as zinc (zinc ionomers are sold by duPont under the trade names Surlyn 1705 or Surlyn 1650), then the flexible film required further curing after manufacture, such as heat treatment, in order to exhibit the desired antistatic characteristics.

Background of the Invention

When two surfaces are brought in contact with each other, a transfer of electrons may occur resulting in a residual static electrical charge when the surfaces are separated. This phenomena is known as triboelectricity. If the surface is composed of a material that is a conductor, the electrons will dissipate quickly thereby eliminating the excess charge. On the other hand, if the surface is composed of a material that is an insulator (a dielectric), the surface charge takes much longer to dissipate.

Thermoplastic polymers are typically excellent insulators and thus are unsatisfactory for uses, such as packaging circuit boards, requiring a nature that will dissipate charges. As the polymers accumulate high charges promoting an attraction for dust and dirt, they can discharge to any lower potential body with which they come in contact. To modify a polymer to have antistatic characteristics and dissipate charges, the conductivity might be increased which in turn causes an increase in the rate of static dissipation. This has been accomplished in the past by the use of antistatic agents to promote static-charge decay of surfaces thereby reducing clinging effect, eliminating spark discharge, and preventing accumulation of dust.

It is well known that static charge of an object can be reduced by increasing the moisture content of the surrounding atmosphere, the moisture content of the object, or the moisture content of the packaging and thus the approach in the past has been to use an antistatic agent which will chemically modify the polymeric packaging to impart hydrophilic properties to it by providing functional groups that attract moisture to it. For instance, it is well known to apply external antistatic agents onto polymeric film by conventional coating or painting methods. Also, it is well known to employ internal antistatic agents which are volume dispersed in the polymer; i.e. incorporated into the polymer by compounding or extrusion prior to or during molding or film-forming operations, and work by migrating to the polymer surface. This migration is colloquially referred to in the art of antistatic polymer technology as a "blooming" effect. When the antistatic agent has not remained volume dispersed but instead has bloomed to the surface, the mechanism for moisture attraction is the same as with the painted on external antistatic agents. The atmospheric moisture is attracted allowing decay or dissipation of static charges, i.e. such films depend on ambient humidity. Accordingly, a high rate of blooming is required. Such films can overbloom and lose their antistatic character if subjected to a 24 hour water shower or a prolonged hot atmosphere.

An example of a film comprising a blend of polyether block amide copolymer with an aromatic sulfonamide antistatic agent is disclosed in U.S. Pat. No. 4,899,521 (Feb. 13, 1990) to Marvin R. Havens, assignor to W. R. Grace & Co.-Conn., the disclosure of which is incorporated herein by reference. This patent states that the polyether block amide copolymer film without the aromatic sulfonamide antistatic agent is not antistatic, i.e. will not dissipate 5000 volts DC in the specified time. This patent also states testing of a film for antistatic characteristics by dissipation of 5000 VDC is disclosed in Federal Test Method Standard 101C, Method 4046.1 This test is further discussed below.

STATEMENT OF THE INVENTION

The present invention provides a thermoplastic antistatic film, said film comprising hydrophilic polyether block amide copolymer and a compatible polymer, wherein said film, in the absence of an added antistatic agent, is antistatic in accordance with the military specification test in that said film will dissipate 5000 volts direct current in about 2000 milliseconds or less, and said film has a degree of hydrophilicity suitable for packaging electronic devices.

The present invention also provides a method to decrease the hydrophilicity of a hydrophilic polyether block amide copolymer when making an antistatic film therefrom comprising extruding a thermoplastic antistatic film, said film containing hydrophilic polyether block amide copolymer and compatible polymer, whereby in the absence of an added antistatic agent, said film is antistatic in accordance with the military specification test in that said film will dissipate 5000 volts direct current in about 2000 milliseconds or less, and said film has a degree of hydrophilicity suitable for packaging electronic devices.

The present invention also provides a package comprising a static sensitive device having conformed thereabout a thermoplastic antistatic film said film containing hydrophilic polyether block amide copolymer and compatible polymer, wherein in the absence of an added antistatic agent, said film is antistatic in accordance with the military specification test in that said film will dissipate 5000 volts direct current in about 2000 milliseconds or less, and said film has a degree of hydrophilicity suitable for packaging electronic devices.

Preferably the compatible polymer is chosen from carbonyl-containing polymers, such as polymers having an amide group functionality, polymers having an acid group functionality, polymers having an ester group functionality, or from mixtures thereof.

Also, the antistatic film may be in air cushion form, or laminated to other films such as to metallized polyester or to foils for enhanced electrical effects or protection.

Also, the present invention provides a thermoplastic antistatic film, said film comprising hydrophilic inherently antistatic polymer and a compatible poisoner, wherein in the absence of an added antistatic agent, said film is antistatic in accordance with the military specification test in that said film will dissipate 5000 volts direct current in about 2000 milliseconds or less, and said film has a degree of hydrophilicity suitable for packaging electronic devices.

Also, the present invention provides a method to decrease the hydrophilicity of a hydrophilic inherently antistatic polymer when making an antistatic film therefrom comprising extruding a thermoplastic antistatic film, said film containing hydrophilic inherently antistatic polymer and compatible polymer, whereby in the absence of an added antistatic agent, said film is antistatic in accordance with the military specification test in that said film will dissipate 5000 volts direct current in about 2000 milliseconds or less, and said film has a degree of hydrophilicity suitable for packaging electronic devices.

Also, the present invention provides a package comprising a static sensitive device having conformed thereabout a thermoplastic antistatic film, said film containing hydrophilic inherently antistatic polisher and compatible polymer, wherein in the absence of an added antistatic agent, said film is antistatic in accordance with the military specification test in that said film will dissipate 5000 volts direct current in about 2000 milliseconds or less, and said film has a degree of hydrophilicity suitable for packaging electronic devices.

Also, the present invention provides a method to decrease the hydrophilicity of a hydrophilic polyether block amide copolymer when making an antistatic film therefrom comprising forming a thermoplastic antistatic film from a blend of hydrophilic polyether block amide copolymer and compatible polymer, said compatible polymer being present in an amount sufficient whereby said film has a degree of hydrophilicity suitable for packaging static sensitive devices and said hydrophilic polyether block amide copolymer being present in an amount sufficient whereby in the absence of an added antistatic agent, said film is antistatic in accordance with the military specification test in that said film will dissipate 5000 volts direct current in about 2000 milliseconds or less. The present invention also provides that when said compatible polymer comprises a multi-valent ionomer, then said forming comprises (1) extruding said hydrophilic polyether block amide copolymer and said multi-valent ionomer into a film, which film has a degree of hydrophilicity suitable for packaging static sensitive devices, and (2) then subjecting said film to curing treatment, whereby from said curing treatment, said film is antistatic in accordance with the military specification test, even in the absence of an added antistatic agent, in that said film will dissipate 5000 volts direct current in about 2000 milliseconds or less. It is preferred that said curing treatment comprises heating said film for up to about 12 days at a temperature up to about 160° F. (71.1° C.).

The present invention also provides a method to decrease the hydrophilicity of a hydrophilic polyether block amide copolymer when making an antistatic film therefrom comprising (1) selecting a compatible polymer, (2) blending said compatible polymer with said hydrophilic polyether block amide copolymer in an amount sufficient to reduce the hydrophilicity of the polyether block amide copolymer, and (3) forming a film from said blended compatible polymer and hydrophilic polyether block amide copolymer, whereby (a) said film has a degree of hydrophilicity suitable for packaging static sensitive devices and (b) in the absence of an added antistatic agent, said film is antistatic in accordance with the military specification test in that said film will dissipate 5000 volts direct current in about 2000 milliseconds or less. The present invention also provides that when said compatible polymer comprises a multi-valent ionomer, then said forming comprises (I) extruding said hydrophilic polyether block amide copolymer and said multi-valent ionomer into a film, which film has a degree of hydrophilicity suitable for packaging electronic devices, and (II) then subjecting said extruded film to curing treatment, whereby from said curing treatment, said film is antistatic in accordance with the military specification test, even in the absence of an added antistatic agent, in that said film will dissipate 5000 volts direct current in about 2000 milliseconds or less. Preferably, said curing treatment comprises heating said film for up to about 12 days at a temperature up to about 160° F. (71.1° C.).

DETAILED DESCRIPTION

Any hydrophilic inherently antistatic polymer may be employed in the present invention. Preferably, the hydrophilic inherently antistatic polymer is chosen from hydrophilic polyether block amide copolymers.

The polyether block amides, also known as polyamide-polyether copolymers are of the general formula

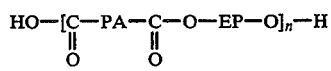

wherein PA represents the polyamide segment and EP the polyether segment, and n is the number of repeating units in the polymer chain. These polyamide-polyether copolymers are abbreviated herein as PAEPC. The terms "polyether block amide copolymer", "polyamide-polyether copolymer", and "PAEPC" are used interchangeably herein.

Polyether block amide copolymers, i.e. polyamidepolyether copolymers (PAEPC), are described in U.S. Pat. No. 4,361,680 (1982) to Borg et al; U.S. Pat. No. 4,332,920 (1982) to Foy et al; and U.S. Pat. No. 4,331,786 (1982) to Foy et al, (all assigned to ATO Chimie) the disclosures of which are incorporated herein by reference. Also an advertising brochure from Atochem, entitled "Pebax(R) Technical Notice", June 1986, No. 507E-9E, the disclosure of which is incorporated herein by reference, describes properties of various PAEPC's marketed under the trade-name Pebax(R), and in particular at pages 13-15 describes the electrical properties of the various Pebax copolymers. The brochure states that Pebax 4011 by itself is antistatic in nature. Pebax 4011 is extremely hydrophilic, as the brochure also states it will absorb 120% of its weight in water when allowed to soak for 24 hours.

U.S. Pat. No. 4,899,521 to Havens, mentioned above, states that this Pebax 4011 material is so hydrophilic that it would be inappropriate for packaging electronic devices as so much moisture from the atmosphere would be attracted that as the water released it would corrode the packaged device. Thus, '521 states "that by the terms polyether block amide copolymer, polyamide-polyether copolymer, and PAEPC, which are used interchangeably, it is not intended to include the extremely hydrophilic Pebax(R) 4011 or any other polyether block amide copolymer that is as hydrophilic as, or substantially as hydrophilic as, Pebax(R) 4011."

In contrast, in the instant invention it is intended to include Pebax 4011 and other polyether block amide copolymers that are as hydrophilic as, or substantially as hydrophilic as Pebax 4011.

Thus, by "hydrophilic polyether block amide copolymer" as that term is used herein, it is intended to mean any PAEPC which will absorb about 30% or more, more preferably about 45% or more, more preferably about 80% or more, more preferably about 100% or more of its weight in water when allowed to soak for 24 hours, such as described in test method ASTM D 570, and is thus inherently antistatic.

More generally, by "hydrophilic inherently antistatic polymer" as that term is used herein, it is intended to mean any inherently antistatic polymer that will absorb about 30% or more of its weight in water when allowed to soak for 24 hours. Obviously, unless a way is found to decrease the hydrophilicity such materials are inappropriate for packaging static sensitive devices.

Moreover, such hydrophilic polymers are typically not used as resins in extrusion because their absorbancy of water interferes with extrusion. The heat and pressure of extrusion vaporizes the moisture so at the extruder die exit there are problems with steam which cause tracks or voids in the extruded tubular film, which, in severe cases, can make the blown extruded tube collapse.

It has been unexpectedly found that when hydrophilic inherently antistatic polymer, preferably hydrophilic PAEPC, is blended with a compatible polymer, absent any antistatic agent, and the resultant made into a thermoplastic film, the film will be antistatic yet the film will not have a problem with corroding an electronic component wrapped with the film. Lack of a problem is determined by the film passing a corrosion test. The details of the military specification corrosion test are further described below.

Compatible polymers, for blending with the hydrophilic PAEPC, may be those that have a polar group functionality repeating in the polymer chain or appended to the polymer chain. The polar group may preferably be carbonyl. Such carbonyl-containing polymers include, but are not limited to, polymers having an acid group functionality, an ester group functionality, or an amide group functionality.

When the carbonyl-containing polymer is chosen from the "acid group" polymers, the "acid group" polymer may be a polymer containing carboxylic acid moieties.

By "polymers containing carboxylic acid moieties" as that term is used herein it is intended to mean copolymers of (i) a major amount by mol % of an alpha-olefin having the formula $RCH=CH_2$ wherein R is H or $C_1$ to $C_8$ alkyl and (ii) a minor amount by mol % of an alpha,beta-ethylenically unsaturated carboxylic acid. Preferably, the alpha,beta-ethylenically unsaturated carboxylic acid is present in an amount by mol % of about 40% or less, more preferably about 30% or less, most preferably about 20% or less.

Also, by the term "polymers containing carboxylic acid moieties", it is intended to mean that the copolymer of an alpha-olefin having the formula $RCH=CH_2$ wherein R is H or $C_1$ to $C_8$ alkyl and an alpha,beta-ethylenically unsaturated carboxylic acid may be wholly or partially neutralized with a suitable cation such as zinc cation or sodium cation, which are known as ionomers. Examples of such "polymers containing carboxylic acid moieties", which are suitable for use in the present invention include, but are not limited to, the following or their ionomeric version: ethylene/acrylic acid copolymers, ethylene/methacrylic acid copolymers, ethylene/itaconic acid copolymers, ethylene/methyl hydrogen maleate copolymers, ethylene/maleic acid copolymers, ethylene/methyl hydrogen maleate/ethyl acrylate terpolymers, ethylene/methacrylic acid/vinyl acetate terpolymers, ethylene/acrylic acid/vinyl acetate terpolymers, ethylene/acrylic acid/vinyl alcohol terpolymers, ethylene/propylene/acrylic acid terpolymers, ethylene/styrene/acrylic acid terpolymers, ethylene/acrylic acid/methyl methacrylate terpolymers, ethylene/methacrylic acid/ethyl acrylate terpolymers, ethylene/itaconic acid/methyl methacrylate terpolymers, ethylene/methacrylic acid/acrylonitrile terpolymers, ethylene/fumaric acid/vinyl methyl ether terpolymers, ethylene/vinyl chloride/acrylic acid terpolymers, ethylene/vinylidene chloride/acrylic acid terpolymers, ethylene/vinyl fluoride/methacrylic acid terpolymers, and ethylene/chlorotrifluroethylene/methacrylic acid terpolymers. Commercially available copolymers of an alpha-olefin having the formula $RCH=CH_2$ wherein R is H or $C_1$ to $C_8$ alkyl and an alpha,beta-ethylenically unsaturated carboxylic acid typically are produced by the copolymerization of ethylene and a carboxylic acid comonomer therefor such as acrylic acid or methacrylic acid.

Suitable such acid copolymers are the Primacor TM polymers, supplied by Dow Chemical Company, Midland, Mich. Primacor is produced by the copolymerization of ethylene and acrylic acid. Ethylene-acrylic acid copolymers are herein referred to as EAA copolymer. A very suitable Primacor polymer is Primacor 1410 or Primacor 5981. Other suitable such acid copolymers are sold under the trade name Nucrel by dupont; they are produced by the copolymerization of ethylene and methacrylic acid. Ethylene-methacrylic acid copolymers are herein referred to as EMAA copolymers. Ionomers are commercially available as Surlyn(R) from the E. I. dupont de Nemours Company of Wilmington, Del., and are described in detail in U.S. Pat. Nos. 3,355,319 and 3,845,163. A very suitable Surlyn is Surlyn 1601, which is sodium metal salt partially neutralized ethylene-methacrylic acid copolymer.

When the carbonyl-containing polymer is chosen from the "amide group" polymers, then as the "amide group" polymer, polyamides may be advantageously employed. By polyamide, i.e. "nylon" polymer, it is intended to include copolymers and terpolymers thereof. Various suitable nylon polymers are nylons which can be produced as polymers of the reaction products of (i.e. polycondensation products and/or polyaddition products of) various combinations of diacids and diamines or lactams as well as copolymers, terpolymers, et cetera, combinations of lactams, diacids, and diamines with lactams, multiple diacids and dibases with lactams, et cetera. It is intended to include, but not limit to, the several such nylons given below. Polymers of the reaction products of diacids and dibases include the polymer of the reaction product of adipic acid and hexamethylene diamine (commonly known as nylon 6/6), the polymer of the reaction product of sebacic acid and hexamethylene diamine (commonly known as nylon 6/10), and polymers of the reaction product of hexamethylenediamine and a 12-carbon dibasic acid (commonly known as nylon 6/12). Polymers of the reaction product of lactams include, but are not limited to caprolactam (commonly known as nylon 6), the polycondensation product of the monomer 11-amino undecanoic acid (commonly known as nylon 11) and the addition product of lauryllactam or cyclodecalactam (both of which are commonly known as nylon 12). These and similar lactam copolymers are available with a wide variety of caprolactam and lauryllactam relative amounts. Other commercially available nylons include copolymers made from caprolactam with adipic acid and hexamethylene diamine (commonly known as nylon 666) and terpolymers made from caprolactam and lauryl lactam with adipic acid and hexamethylene diamine (commonly known as nylon 66612). It is further possible to blend physically and extrude various nylons to achieve a wide range of physical properties.

Suitable commercially available polyamides are Ultramid C-35, which is a nylon 666 sold by BASF, or Grilon W6220, which is a nylon 669 sold by Emser.

For a film layer, the hydrophilic inherently antistatic polymer, preferably hydrophilic PAEPC, and compatible polymer should be present on a weight % basis ranging from about 5% hydrophilic polymer and about 95% compatible polymer to about 95% hydrophilic polymer and about 5% compatible polymer, more preferably about 30% hydrophilic polymer and 70% compatible polymer to about 70% hydrophilic polymer and about 30% compatible copolymer. Even more preferably, the amounts are from about 40% hydrophilic polymer and about 60% compatible polymer to about 60% hydrophilic polymer and about 40% compatible polymer.

The corrosion test is determined as per Federal Test Method Standard 101C, Method 3005, as modified per Military Specification Mil-B 81705 C. In general the test involves placing a piece of the film on a metal coupon, such as a copper coupon or a low carbon steel coupon in a closed chamber at about 65% relative humidity and about 120° F. (about 49% C.) for about 72 hours, and then the coupon is qualitatively observed for corrosion spots.

The antistatic property is exhibited by the ability of the polymeric film to promote static charge decay, i.e. time to dissipate a static charge. The film is able to dissipate 99% of an applied static charge of ±5000 volts in a short amount of time, i.e. less than 3 seconds, more preferably less than 2 seconds (2000 milliseconds). Federal Test Method Standard 101C, Method 4046.1, "Electrostatic Properties of Materials" states less than 2000 ms and thus it is preferred to have a material that complies with 101C. Decay meters for measuring the time for dissipation of the applied volts are commercially available, such as the 406C static decay meter supplied by Electrotech Systems, Inc. The static decay time is abbreviated herein as SDT.

As illustrated in the Examples below, the films of the invention will perform excellently as an antistatic film (i.e. as per the Static Decay Time test dissipate 5000 volts in less than the highly preferred 2000 milliseconds) even after abuse such as a hot oven (160° F.) and some even after such extreme abuse as a 24-hour water shower.

Also, as illustrated in the Examples, the films were tested for resistivity. The resistivity tests were performed as per ASTM D257 (ASTM is an abbreviation for the American Society for Testing Materials), except that the equilibration time was 48 hours and the relative humidity was controlled at 12% ±3%. (ASTM D257, contains a cross-reference to the conditioning specifications in ASTM D618, which says 96 hours at 50% RH.) The Department of Defense (DOD) and the Electronics Industry Association (EIA) each have their own ranges on surface resistivity of a material as follows:

| SURFACE RESISTIVITY RANGES IN OHMS/SQUARE | | | |
|---|---|---|---|
| Insulative | Antistatic | Static Dissipative | Conductive |
| DOD > $10^{14}$ | $10^{14}$ to $10^9$ | $10^9$ to $10^5$ | <$10^5$ |
| EIA > $10^{13}$ | $10^{13}$ to $10^5$ | | <$10^5$ |

As can be seen, there are two main differences. One is that EIA defines insulative as above about $10^{13}$ ohms/square, whereas DOD defines insulative as above about $10^{14}$ ohms/square. The other difference is that EIA has one range of about $10^{13}$ to about $10^5$ ohms/square as antistatic, which results in antistatic being synonymous with static dissipative. On the other hand, DOD divides this range into two separate ranges of about $10^{14}$ to about $10^9$ ohms/square for antistatic and about $10^9$ to about $10^5$ ohms/square for static dissipative. Frequently the literature, especially older literature, equates antistatic with static dissipative in discussions about static electricity.

MATERIALS EMPLOYED IN THE EXAMPLES

The linear low density polyethylene (abbreviated LLDPE) employed in the Examples was Dowlex 4002 having a melt index of 3.3 and a density of 0.912, supplied by Dow Chemical. The comonomer of Dowlex 4002 is octene.

The low density polyethylene (abbreviated LDPE) was NA 345-166 from Quantum/USI; it has a density of 0,918 and a melting point of 117° C.

For multi-layer films, a suitable adhesive polymer layer may be employed to promote interlayer adhesion. The adhesive polymer was Bynel 3062 from dupont (abbreviated ADH 1) in Examples I and II, and was Plexar 107 from Quantum/USI (abbreviated ADH 2) in Examples III and IV. Sometimes in some of the films of Example V, the adhesive polymer was Bynel 4125 (formerly E-325) from du Pont (abbreviated as ADH 3), but sometimes in some of the films of Example V, the adhesive polymer used was ADH 1.

The hydrophilic polyamide-polyether block copolymer in Examples I, II, III, and IV was Pebax 4011 from Atochem, and is designated in these Examples as PAEPC 1. In Example V, the hydrophilic polyamide-polyether block copolymer was MX 1074, a new Pebax from Atochem, and is designated in this Example as PAEPC 2. MX 1074 is a copolymer of 50% by weight nylon 12 and 50% by weight polyethylene oxide; MX 1074 absorbs about 48% of its weight in water when allowed to soak for 24 hours.

Polyamide 1 (abbreviated PA 1) was Ultramid C-35 from BASF and Polyamide 2 (abbreviated PA 2) was Grilon W6220 from Emser. Polyamide 3 (abbreviated PA 3) was Grilon CF6S, a nylon 6/12 sold by Emser.

Polyamide 4 (abbreviated PA 4) was a nylon 12 sold under the tradename Vestamid 1801 from Huls.

An ionomer was Surlyn 1601 from dupont, a sodium ionomer of EMAA (designated in the Examples as Na ionomer 1). Another ionomer was Surlyn 1856 from dupont, another sodium ionomer (designated in the Examples as Na ionomer 2). Another ionomer was Surlyn 1650 from dupont, which is a zinc ionomer of EMAA (designated in the Examples as Zn ionomer 1). Another ionomer was Surlyn 1705 from dupont, which is a zinc ionomer (designated in the Examples as Zn ionomer 2). Another ionomer was Surlyn AD 8255 from du Pont, which is a Zn ionomer (designated in Example V as ionomer 3).

The ethylene vinyl acetate copolymer (abbreviated EVA) used the films in Example V was resin PE 1345YY from Rexene. It is an EVA with 3.3 to 3.7 % VA, a melt index of 1.8 to 2.2, and a density of 0.924 g/cc.

Manufacture of Films

Typically, in the manufacture of films, a suitable polymer usually in the form of pellets or the like, is brought into a heated area where the polymer feed is melted and heated to its extrusion temperature and extruded as a tubular "blown bubble" through an annular die. Other methods, such as "slot die" extrusion wherein the resultant extrudate is in planar, as opposed to tubular form are also well known. If heat shrinkable film is desired, then after extrusion, the film is typically cooled and then reheated and stretched, i.e. oriented by "tenter framing" or by inflating with a "trapped bubble", to impart the heat-shrinkable property to the film. For multi-layer films, such as those made by coextrusion of multiple individual resins or blends, a suitable adhesive polymer layer may be employed to promote interlayer adhesion.

If desired, irradiation, typically via an electron beam, preferably takes place prior to the stretching for orienting the film. However, such irradiation is not necessary since a very suitable packaging film is obtained without irradiation.

After the film has been made, it may then be stored in rolls and utilized to package a wide variety of items. The material may still be in tubular form or it may have been slit and opened up to form a sheet of film material. In this regard, the product to be packaged may first be enclosed in the material by heat sealing the film to itself where necessary and appropriate to form a pouch or bag and then inserting the product therein. Alternatively, a sheet of the material may be utilized to overwrap the product. Additionally, the film may be used for skin packaging a product. These packaging methods are all well known to those of skill in the art. If the material is of the heat-shrinkable, i.e. "oriented", type, then after wrapping, the enclosed product may be subjected to elevated temperatures, for example, by passing the enclosed product through a hot air tunnel. This causes the enclosing heat-shrinkable film to shrink around the product to produce a tight wrapping that closely conforms to the contour of the product. As stated above, the film sheet or tube may be formed into bags or pouches and thereafter utilized to package a product. In this case, if the film has been formed as a tube it may be preferable first to slit the tubular film to form a film sheet and thereafter form the sheet into bags or pouches. Such bag or pouch forming methods, likewise, are well known to those of skill in the art.

With regard to the new matter in the instant continuation-in-part vis-a-vis its parent continuation-in-part application Ser. No. 647,859 (see Examples V and VI), Pebax MX 1074 from Atochem was employed. With regard to the new matter in the continuation-in-part application Ser. No. 647,859 vis-a-vis its parent application Ser. No. 578,961. (see Examples III–IV), it has been unexpectedly discovered that when the compatible polymer was a metal ionomer where the metal was polyvalent such as zinc which is a +2 metal (such zinc ionomers are sold by dupont under the trade names Surlyn 1705 or Surlyn 1650), then the flexible film required further curing after manufacture, such as heat treatment for a time sufficient and at a temperature sufficient, in order to exhibit the desired antistatic characteristics. The heat treatment employed in these Examples was 12 days in a hot 160° F. oven (71.1° C.); however, it could be readily determined without undue experimentation by the person skilled in the art to employ a shorter time and/or a lower temperature. One would simply leave the sample in the oven, for instance for 6 days instead of 12, and then run a static decay time test to see if the SDT were under about 2000 milliseconds or less. Alternatively, another form of curing as shown in these Examples was to subject the film to a water wash for 24 hours. Likewise, shorter times for the water wash could readily be determined by the person skilled in the art without undue experimentation by simply running the wash, for instance for 12 hours instead of 24, and then running the SDT test to see if the film were exhibiting 2000 milliseconds or less.

The above general outline for manufacturing of films is not meant to be all inclusive since such processes are well known to those in the art. For example, see U.S. Pat. Nos. 4,274,900; 4,229,241; 4,194,039; 4,188,443; 4,048,428; 3,555,604; 3,741,253; 3,821,182; and 3,022,543. The disclosures of these patents are generally representative of such processes and are hereby incorporated by reference.

Many other process variations for forming films are well known to those in the art. For example, conventional pressing, thermoforming or laminating techniques (including corona laminating) may be employed. For instance, multiple layers may be first coextruded with additional layers thereafter being laminated thereon, or two multi-layer tubes may be coextruded with one of the tubes thereafter being laminated onto the other. In addition, the instant films may be laminated to metallized polyester or to foil for additional electrical protection.

The inventive film may also be fashioned to have cushioning characteristics by laminating together two webs of film in air cushion form with air cushioning machinery such as that described in U.S. Pat. Nos. 4,576,669 and 4,579,516, both to Caputo, or that described in U.S. Pat. Nos. 3,416,984; 3,405,020; 3,586,565; and 3,785,899, all assigned to Sealed Air, or that described in U.S. Patent Nos. 4,314,865; 4,427,474; and 4,412,879, all three to Ottaviano, or that described in PCT Published Application WO 89/00919 published Feb. 9, 1989 (based on priority U.S. Ser. No. 78,385 filed Jul. 27, 1987) to Caputo, the disclosures of which are incorporated herein by reference.

The term "polymer" as used herein generally includes, but is not limited to, homopolymers, copolymers, such as, for example block, graft, random and alternating copolymers, terpolymers, et cetera, and blends and modifications of these. Furthermore, unless they are otherwise specifically limited, the terms "polymer" or "polymer resin" shall include all possible structures of the material. These structures include, but are not limited to, isotactic, syndiotactic and random symmetries.

As used herein the term "extrusion" or the term "extruding" is intended to include coextrusion, extrusion coating, or combinations thereof, whether by tubular methods, planar methods, or combinations thereof.

The following Examples are intended to illustrate the preferred embodiments of the invention and it is not intended to limit the invention thereby.

EXAMPLE I (MAKING THE FILMS)

Three coextruded films were made. These were unoriented. All were 5 layers of the structure: A/B/C/B/A, where the composition of each layer was as follows, where percents indicated were % by weight:

| LAYER | COMPOSITION |
|---|---|
| | FILM 1 |
| A | 50% PAEPC 1 + 50% PA 1 |
| B | ADH 1 |
| C | LLDPE |
| B | ADH 1 |
| A | 50% PAEPC + 50% PA 1 |
| | FILM 2 |
| A | 50% PAEPC 1 + 25% Na IONOMER 1 + 25% PA 1 |
| B | ADH 1 |
| C | LLDPE |
| B | ADH 1 |
| A | 50% PAEPC 1 + 25% Na IONOMER 1 + 25% PA 1 |
| | FILM 3 |
| A | 50% PAEPC 1 + 25% PA 1 + 25% PA 2 |
| B | ADH 1 |
| C | LLDPE |
| B | ADH 1 |
| A | 50% PAEPC 1 + 25% PA 1 + 25% PA 2 |

EXAMPLE II (TESTING FILM PROPERTIES OF EXAMPLE I)

The films 1, 2, and 3 that were made in Example I were tested for surface resistivity, static decay time (SDT) and corrosion. For surface resistivity and static decay time, 4 samples of each film were tested and the average is reported below. Prior to the testing, all the film samples were equilibrated at a low relative humidity of about 12% at about 72° F. (22.2° C.) for 48 hours, and then tested. Also, prior to equilibration and testing, some samples were abused by being held for 12 days in a hot oven at 160° F. (71.1° C.) and some were abused by being subjected to a water wash for 24 hours. The abused samples are thus designated below.

| FILM | SURFACE RESISTIVITY OHMS/SQUARE | SDT MILLISECONDS |
|---|---|---|
| | AS RECEIVED TESTS (NO ABUSE) | |
| 1 | $1 \times 10^{12}$ | 718 |
| 2 | $4 \times 10^{11}$ | 103 |
| 3 | $1 \times 10^{12}$ | 657 |
| | 24 HOUR WATER WASH ABUSE TESTS | |
| 1 | $1 \times 10^{12}$ | 241 |
| 2 | $3 \times 10^{11}$ | 135 |
| 3 | $2 \times 10^{11}$ | 260 |
| | 12 DAY HOT OVEN ABUSE TESTS | |
| 1 | $2 \times 10^{12}$ | 976 |
| 2 | $1 \times 10^{11}$ | 103 |
| 3 | $2 \times 10^{12}$ | 1470 |
| | CORRESION TESTS | |

| FILM | COPPER COUPONS | LOW CARBON STEEL COUPONS |
|---|---|---|
| 1 | NONE | NONE |
| 2 | STAIN* | NONE |
| 3 | NONE | NONE |

*STAIN does not indicate corrosion, but rather indicates a shift in color hue.

EXAMPLE III (MAKING FILMS)

Five coextruded films were made. These were unoriented. This was similar to the films in Example I, except that in this example all films were five layers of the structure: A/B/C/B/D, where the composition of each layer was as recited below- The percentages below indicated were measured as % by weight:

| LAYER | COMPOSITION |
|---|---|
| | FILM 1 |
| A | 60% PAEPC 1 + 40% Na IONOMER 1 |
| B | ADH 2 |
| C | LLDPE |
| B | ADH 2 |
| D | LDPE |
| | FILM 2 |
| A | 60% PAEPC 1 + 40% Zn IONOMER 1 |
| B | ADH 2 |
| C | LLDPE |
| B | ADH 2 |
| D | LDPE |
| | FILM 3 |
| A | 60% PAEPC 1 + 40% Na IONOMER 2 |
| B | ADH 2 |
| C | LLDPE |
| B | ADH 2 |
| D | LDPE |
| | FILM 4 |
| A | 60% PAEPC + 40% Zn IONOMER 2 |
| B | ADH 2 |
| C | LLDPE |
| B | ADH 2 |
| D | LDPE |
| | FILM 5 |
| A | 60% PAEPC + 20% PA 3 + 20% Zn IONOMER 2 |
| B | ADH 2 |
| C | LLDPE |
| B | ADH 2 |
| D | LDPE |

EXAMPLE IV (TESTING FILM PROPERTIES OF EXAMPLE III)

The films 1, 2, 3, 4, and 5 made in Example III were tested for surface resistivity and static decay time (SDT). Prior to the testing, all the film samples were equilibrated at a low relative humidity of about 12% at about 72° F. (22.2° C.) for 48 hours, and then tested. Also, prior to equilibration and testing, some samples were abused by being held for 12 days in a hot oven at 160° F. (71.1° C.) and some samples were abused by being subjected to a water wash for 24 hours, and then the abused samples were tested. The abused samples are thus designated below.

| FILM | IONOMER IN SURFACE LAYER A | SURFACE RESISTIVITY (OHMS/SQUARE) | | |
|---|---|---|---|---|
| | | AS RECEIVED (NO ABUSE) | 24 HOUR WATER WASH ABUSE | 12 DAY HOT OVEN ABUSE |
| 1 | Na | $8.5 \times 10^{11}$ | $1.1 \times 10^{12}$ | $1.1 \times 10^{12}$ |

| FILM | | | | |
|---|---|---|---|---|
| 2 | Zn | $5.0 \times 10^{12}$ | $1.1 \times 10^{12}$ | $5.3 \times 10^{11}$ |
| 3 | Na | $4.1 \times 10^{11}$ | $3.7 \times 10^{11}$ | $5.9 \times 10^{9}$ |
| 4 | Zn | $4.3 \times 10^{12}$ | $5.4 \times 10^{11}$ | $5.6 \times 10^{11}$ |
| 5 | Zn | $3.5 \times 10^{12}$ | $3.6 \times 10^{11}$ | $4.9 \times 10^{11}$ |

| | | STATIC DECAY TIME (MILLISECONDS) | | |
|---|---|---|---|---|
| FILM | IONOMER IN SURFACE LAYER A | AS RECEIVED (NO ABUSE) | 24 HOUR WATER WASH ABUSE | 12 DAY HOT OVEN ABUSE |
| 1 | Na | 221 | 1108 | 78 |
| 2 | Zn | 5764 | 1018 | 508 |
| 3 | Na | 353 | 417 | 65 |
| 4 | Zn | 5997 | 433 | 621 |
| 5 | Zn | 5972 | 343 | 611 |

As can be seen, when the surface layer A contained Pebax 4011 blended with Surlyn that was a sodium ionomer (samples 1 and 3), the static decay time performance was fine for all samples, whether abused or not; an SDT well within the military specification of 2000 milliseconds or less was observed. However, when the surface layer A contained Pebax 4011 blended with Surlyn that was a zinc ionomer (samples 2, 4, and 5), unacceptable static decay times were observed when the samples were tested as received. For an acceptable static decay time performance within the military specification of milliseconds or less to be observed, the film was subjected to a further "curing" treatment, i.e. abused by the 24 hour water wash or abused by the 12 day hot oven.

EXAMPLE V (MAKING FILMS)

Three coextruded films were made. These were unoriented. This was similar to the films made in Examples I and III, except that in this example some films were five layers of the structure: A/B/C/B/D, and some films were five layers of the structure: A/B/C/B/A, where the composition of each layer was as recited below.

The percentages below indicated were measured as % by weight:

| LAYER | COMPOSITION |
|---|---|
| | FILM 1 |
| A | 60% PAEPC 2 + 40% PA 4 |
| B | ADH 1 |
| C | LLDPE |
| B | ADH 1 |
| D | EVA |
| | FILM 2 |
| A | 60% PAEPC 2 + 40% PA 4 |
| B | 60% PA 4 + 40% ionomer 3 |
| C | ADH 3 |
| B | 60% PA 4 + 40% ionomer 3 |
| D | EVA |
| | FILM 3 |
| A | 60% PAEPC 2 + 40% PA 4 |
| B | ADH 1 |
| C | LLDPE |
| B | ADH 1 |
| D | 60% PAEPC 2 + 40% PA 4 |

EXAMPLE VI (TESTING FILM PROPERTIES OF EXAMPLE V)

The films 1, 2, and 3 that were made in Example V were tested for surface resistivity, static decay time (SDT) and corrosion. For surface resistivity and static decay time, 4 samples of each film were tested and the average is reported below. Prior to the testing, all the film samples were equilibrated at a low relative humidity of about 12% at about 72° F. (22.2° C.) for 48 hours, and then tested. Also, prior to equilibration and testing, some samples were abused by being held for 12 days in a hot oven at 160° F. (71.1° C.) and some were abused by being subjected to a water wash for 24 hours. The abused samples are thus designated below.

| FILM | SURFACE RESISTIVITY OHMS/SQUARE | SDT MILLISECONDS |
|---|---|---|
| | AS RECEIVED TESTS (NO ABUSE) | |
| 1 | $7.0 \times 10^{11}$ | 1164 |
| 2 | $1.0 \times 10^{12}$ | 2324 |
| 3 | $6.1 \times 10^{11}$ | 1566 |
| | 24 HOUR WATER WASH ABUSE TESTS | |
| 1 | $5.6 \times 10^{11}$ | 5325 |
| 2 | $9.7 \times 10^{11}$ | 3279 |
| 3 | $5.2 \times 10^{11}$ | 1350 |
| | 12 DAY HOT OVEN ABUSE TESTS | |
| 1 | $4.8 \times 10^{11}$ | 1330 |
| 2 | $5.4 \times 10^{11}$ | 1523 |
| 3 | not tested | not tested |

| | CORROSION TESTS | |
|---|---|---|
| FILM | COPPER COUPONS | LOW CARBON STEEL COUPONS |
| 1 | SHOULD BE NONE | SHOULD BE NONE |
| 2 | SHOULD BE NONE | SHOULD BE NONE |
| 3 | SHOULD BE NONE | SHOULD BE NONE |

While certain representative embodiments and details have been shown for the purpose of illustration, numerous modifications to the formulations described above can be made without departing from the invention disclosed.

What is claimed is:

1. A method to decrease the hydrophilicity of a hydrophilic polyether block amide copolymer when making an antistatic film therefrom comprising forming a thermoplastic antistatic film from a blend of hydrophilic polyether block amide copolymer and compatible polymer in a ratio by weight in the range of from about 5:95 to about 95:5, respectively; said compatible polymer comprising a multi-valent ionomer and said forming step comprises (1) extruding said hydrophilic polyether block amide copolymer and said multi-valent ionomer into a film, which film has a degree of hydrophilicity suitable for packaging static sensitive devices, and (2) then subjecting said film to curing treatment, whereby from said curing treatment, said film is antistatic in accordance with the military specification test, even in the absence of an added antistatic agent, in that said film will dissipate 5000 volts direct current in about 2000 milliseconds or less.

2. A method to decrease the hydrophilicity of a hydrophilic polyether block amide copolymer when making an antistatic film therefrom comprising (1) selecting a compatible polymer, (2) blending said compatible polymer with said hydrophilic polyether block amide copolymer in a ratio by weight in the range of from about 5:95 to about 95:5, respectively, and (3) forming a film from said blended compatible polymer and hydrophilic polyether block amide copolymer, whereby (a) said film has a degree of hydrophilicity suitable for packaging static sensitive devices and (b) in the absence of an added antistatic agent; said compatible polymer comprising a multi-valent ionomer and said forming step comprises (1) extruding said hydrophilic polyether block amide copolymer and said multi-valent ionomer into a film, which film has a degree of hydrophilicity suitable for packaging static sensitive devices, and (2) then subjecting said extruded film to a curing treatment, whereby from said curing treatment, said film is antistatic in accordance with the military specification test, even in the absence of an added antistatic agent, in that said film will dissipate 5000 volts direct current in about 2000 milliseconds or less.

3. The method of claim 1, wherein said ratio by weight is in the range of from about 30:70 to about 70:30, respectively.

4. The method of claim 1, wherein said ratio by weight is in the range of from about 40:60 to about 60:40, respectively.

5. The method of claim 2, wherein said ratio by weight is in the range of from about 30:70 to about 70:30, respectively.

6. The method of claim 2, wherein said ratio by weight is in the range of from about 40:60 to about 60:40, respectively.

* * * * *